(12) United States Patent
Cui et al.

(10) Patent No.: US 11,871,629 B2
(45) Date of Patent: Jan. 9, 2024

(54) ORGANIC LIGHT-EMITTING DISPLAY PANEL AND DISPLAY DEVICE

(71) Applicant: Wuhan Tianma Micro-Electronics Co., Ltd., Wuhan (CN)

(72) Inventors: Ruili Cui, Wuhan (CN); Yangzhao Ma, Wuhan (CN); Jiazhu Zhu, Wuhan (CN); Yongzhi Wang, Wuhan (CN); Shanfu Yuan, Wuhan (CN); Yingjie Chen, Wuhan (CN); Tao Peng, Wuhan (CN); Ruiyuan Zhou, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 17/731,095

(22) Filed: Apr. 27, 2022

(65) Prior Publication Data
US 2022/0254861 A1 Aug. 11, 2022

Related U.S. Application Data

(63) Continuation of application No. 16/730,742, filed on Dec. 30, 2019, now Pat. No. 11,355,575.

(30) Foreign Application Priority Data

Jun. 27, 2019 (CN) .......................... 201910569003.X

(51) Int. Cl.
| | | |
|---|---|---|
| H01L 27/32 | (2006.01) | |
| H01L 51/00 | (2006.01) | |
| H01L 51/52 | (2006.01) | |
| H01L 51/56 | (2006.01) | |
| H10K 59/131 | (2023.01) | |
| C23C 14/04 | (2006.01) | |
| H10K 50/82 | (2023.01) | |
| H10K 50/84 | (2023.01) | |

(Continued)

(52) U.S. Cl.
CPC .......... *H10K 59/131* (2023.02); *C23C 14/042* (2013.01); *H10K 50/82* (2023.02); *H10K 50/84* (2023.02); *H10K 71/00* (2023.02); *H10K 71/166* (2023.02); *H10K 2102/302* (2023.02)

(58) Field of Classification Search
None
See application file for complete search history.

(56) References Cited

U.S. PATENT DOCUMENTS

2018/0188837 A1* 7/2018 Son ........................ G06F 3/0443
2020/0134281 A1* 4/2020 Han ...................... H10K 59/131

* cited by examiner

*Primary Examiner* — Robert K Carpenter
(74) *Attorney, Agent, or Firm* — Alston & Bird LLP

(57) ABSTRACT

Provided are an organic light-emitting display panel and a display device. The organic light-emitting display panel includes: a plurality of organic light-emitting units, a first display area and a second display area. The plurality of organic light-emitting units includes first organic light-emitting units in the first display area and second organic light-emitting units in the second display area. The first organic light-emitting units share a first cathode. The second organic light-emitting units include at least one organic light-emitting unit group, each of the at least one organic light-emitting unit group includes at least one organic light-emitting unit. The at least one organic light-emitting unit in a same organic light-emitting unit group shares a second cathode. The second cathode has a zigzag edge segment.

20 Claims, 9 Drawing Sheets

(51) Int. Cl.
*H10K 71/00* (2023.01)
*H10K 71/16* (2023.01)
*H10K 102/00* (2023.01)

ORGANIC LIGHT-EMITTING DISPLAY PANEL AND DISPLAY DEVICE

CROSS-REFERENCES TO RELATED APPLICATIONS

This application is a Continuation Application of U.S. patent application Ser. No. 16/730,742, which claims priority to a Chinese patent application No. CN201910569003.X filed at CNIPA on Jun. 27, 2019, disclosure of which is incorporated herein by reference in its entirety.

TECHNICAL FIELD

The present disclosure relates to the field of display technology and, in particular, to an organic light-emitting display panel and a display device.

BACKGROUND

With the development of display technology, more display panels and display devices, such as organic light-emitting display panel, have entered people's daily life. The organic light-emitting display panel has the advantages of being self-illumination without a backlight, thin and light in volume and weight, broad viewing angle, wide color gamut, and quick response.

At present, a light-emitting element of an organic light-emitting display panel includes an anode, a cathode, and a light-emitting layer and a carrier functional layer between the anode and the cathode. Generally, each film of the light-emitting element in the organic light-emitting display panel is formed by evaporation. A metal mask is required during the evaporation of each film of the organic light-emitting display panel. The metal mask plate is provided with openings so that the evaporation material can be deposited to the corresponding positions of the light-emitting elements in the organic light-emitting display panel exposed by the openings of the metal mask. In the related arts, the light-emitting elements of the organic light-emitting display panel share one cathode.

However, electrostatic charges are generated from friction during the evaporation process and the transport process of the metal mask, and the electrostatic charges stay in the nonconductive films of the organic light-emitting display panel. The display quality of the organic light-emitting display panel is affected during the subsequent display and light emission.

SUMMARY

Embodiments of the present disclosure provide an organic light-emitting display panel and a display device. The organic light-emitting display panel has a low cost and enhanced display effect.

In the first aspect, an embodiment of the present disclosure provides an organic light-emitting display panel. The organic light-emitting display panel includes: a plurality of organic light-emitting units, a first display area and a second display area.

The plurality of organic light-emitting units includes first organic light-emitting units in the first display area and second organic light-emitting units in the second display area.

The first organic light-emitting units share a first cathode.

The second organic light-emitting units includes at least one organic light-emitting unit group, each of the at least one organic light-emitting unit group includes at least one organic light-emitting unit. The at least one organic light-emitting unit in the same organic light-emitting unit group shares a second cathode. The second cathode has a zigzag edge segment.

In the second aspect, an embodiment of the present disclosure provides a display device. The display device includes: a plurality of organic light-emitting units, a first display area and a second display area.

The plurality of organic light-emitting units includes first organic light-emitting units in the first display area and second organic light-emitting units in the second display area.

The first organic light-emitting units share a first cathode.

The second organic light-emitting units includes at least one organic light-emitting unit group, each of the at least one organic light-emitting unit group includes at least one organic light-emitting unit. The organic light-emitting units in the same organic light-emitting unit group share a second cathode. The second cathode has a zigzag edge segment.

DETAILED DESCRIPTION

Figure 1:
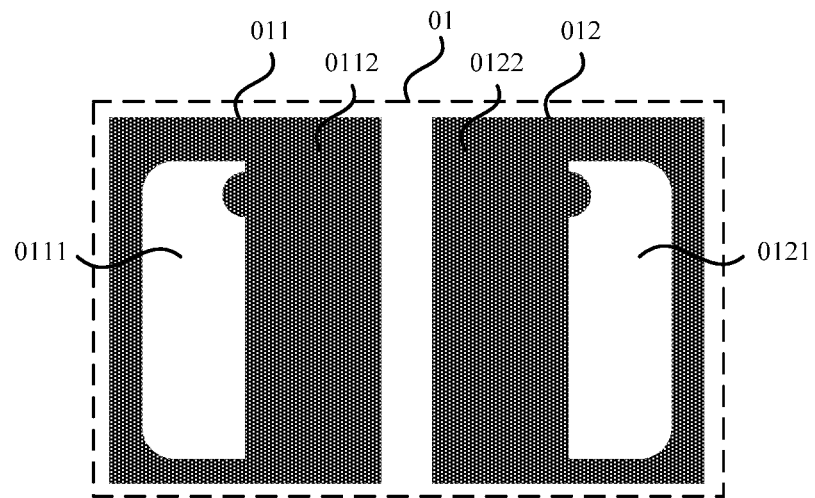
FIG. 1 is a schematic view illustrating a mask in the related art.

Hereinafter the present disclosure will be further described in detail with reference to the drawings and embodiments. It is to be understood that the embodiments set forth below are intended to illustrate and not to limit the present disclosure. Additionally, it is to be noted that, for ease of description, only part, not all, of the structures related to the present disclosure are illustrated in the drawings.

FIG. 1 is a schematic view of a mask. Referring to FIG. 1, a mask 01 includes a first mask 011 and a second mask 012. The first mask 011 includes a first hollowed area 0111 and a first shield area 0112, and the second mask 012 includes a second hollowed area 0121 and a second shield area 0122. A cathode of the organic light-emitting display panel is formed in a deposition chamber, commonly in a evaporation process. When the evaporation is performed with the first mask plate 011, a film is formed on a substrate in an area exposed by the first hollowed area 0111. Mask substrate is typically an insulating plate which is unable to discharge. When the evaporation is performed with the second mask 012, a film is formed on the substrate in an area exposed by the second hollowed area 0121. Thus, the cathode of the organic light-emitting display panel formed on the substrate includes the firm formed in the area exposed by the first mask 011 and the film formed in the area exposed by the second mask 012.

However, with the configuration of the above masks, the cathode of the organic light-emitting display panel is a combination of the films formed in the area exposed by the first mask 011 and the film formed in the area exposed by the second mask 012, and the electrostatic charge generated during the evaporation process and during the transport of the mask are distributed in the cathode of all the light-emitting elements of the organic light-emitting display panel. As a result, when the amount of the electrostatic charge accumulates to large enough, cathode breakdown occurs in the organic light-emitting display panel, causing the organic light-emitting display panel 200 unable to display images normally and reducing the product yield.

Figure 2:
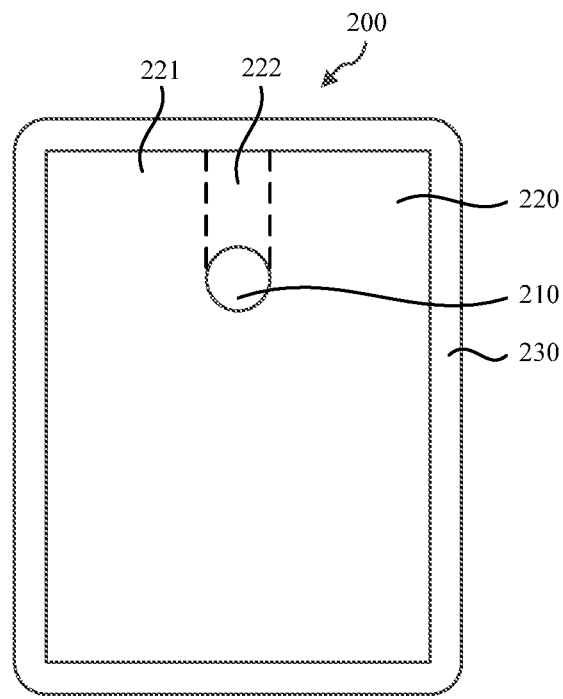
FIG. 2 is a top view of an organic light-emitting display panel according to some embodiments of the present disclosure.
Figure 3:
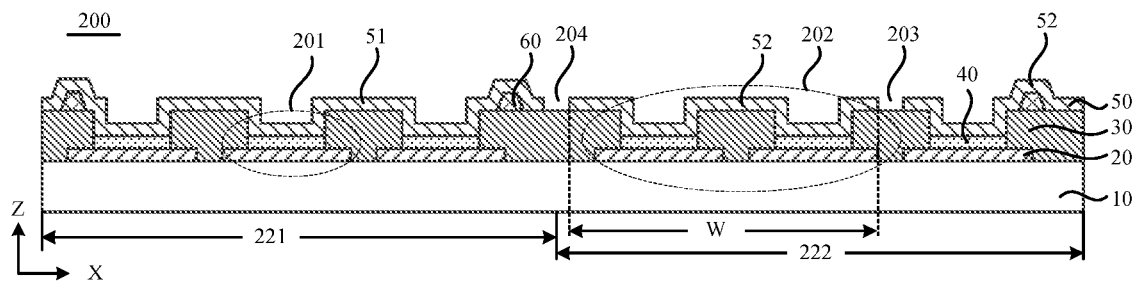
FIG. 3 is a schematic cross-sectional view illustrating films of an organic light-emitting display panel according to embodiments of the present disclosure.

To solve the technical problem mentioned above, an embodiment of the present disclosure provides an organic light-emitting display panel, whose cathode film can be formed by using only one mask. FIG. 2 is a top view of an organic light-emitting display panel according to an embodiment of the present disclosure. FIG. 3 is a schematic view showing films of an organic light-emitting display panel according to an embodiment of the present disclosure. Referring to FIG. 2 and FIG. 3, the organic light-emitting display panel 200 includes a photosensitive module setting area 210, a display area 220 surrounding the photosensitive module setting area 210, and a bezel area 230 surrounding the display area 220. The display area 220 includes a first display area 221 and a second display area 222.

The organic light-emitting display panel 200 includes a plurality of organic light-emitting units 201. The plurality of organic light-emitting units 201 include organic light-emitting units 201 in the first display area 221 and organic light-emitting units 201 in the second display area 222. All the organic light-emitting units 201 in the first display area 221 share a first cathode 51. The organic light-emitting units 201 in the second display area 222 include at least one organic light-emitting unit group 202, and each organic light-emitting unit group 202 includes at least one organic light-emitting unit 201. The organic light-emitting units 201 in the same organic light-emitting unit group 202 share one second cathode 52. Every two adjacent second cathodes 52 are spaced apart from each other by a first gap 203, and the first gap 203 is communicated with the bezel area 230 and the photosensitive module setting area 210.

In an exemplary embodiment, the organic light-emitting display panel 200 includes a substrate 10, and the plurality of organic light-emitting units 201 are formed on the substrate 10. Each organic light-emitting unit 201 includes an anode 20, a cathode 50 and a light-emitting layer 40 sandwiched between the anode 20 and the cathode 50. In addition, the organic light-emitting display panel may further include a carrier function layer (not shown), a pixel defining layer 30, and a spacer 60. The pixel defining layer 30 may be disposed on a side, facing towards the cathode 50, of the anode 20. The spacer 60 can be positioned at a side, facing away from the anode 20, of the pixel defining layer 30. The pixel defining layer 30 is provided with openings each corresponding to one organic light-emitting unit 201. The light-emitting layer 40 of each organic light-emitting unit 201 is located in a respective one of the openings of the pixel defining layer 30. The cathode 50 is generally located on a side, facing away from the anode 20, of the spacer 60 and the pixel defining layer 30. The carrier function layer may include, for example, an electron injection layer, an electron transport layer, a hole injection layer, a hole transport layer and the like. Accordingly, one organic light-emitting unit 201 includes an anode 20, a cathode 50, and a light-emitting layer 40 which are arranged in one opening of the pixel defining layer 30.

The organic light-emitting display panel includes a photosensitive module setting area 210, a display area 220 surrounding the photosensitive module setting area 210, and a bezel area 230 surrounding the display area 220. Various connection lines are arranged in the bezel area 230. The display area 220 is used for displaying information such as images or text. A photosensitive module is arranged in the photosensitive module setting area 210. The photosensitive module is, for example, a camera, an infrared detector, or the like. With arranging the photosensitive module setting area 210 in the display area 220 the organic light-emitting display panel has a high screen-to-body ratio, the organic light-emitting display panel does not need to be configured with a notch or a hole for the photosensitive module, and the effect on the appearance and the display effect of the organic light-emitting display panel due to the notch or hole is avoided.

In general the light transmittance of the photosensitive module setting area 210 of the organic light-emitting display panel 200 should be higher, for example, the light transmittance of the photosensitive module setting area 210 needs to be greater than 85%. However, the cathode 50 of the organic light-emitting display panel 200 is generally made of metal material with a low work function and has a low light transmittance, for example, the light transmittance of the cathode 50 may be 45%. Therefore the cathode 50 with a low light transmittance cannot be disposed in the photosensitive module setting area 210 of the organic light-emitting display panel 200.

Referring to FIG. 2 and FIG. 3, all the organic light-emitting units 201 in the first display area 221 share one first cathode 51, and all the organic light-emitting units 201 in the same light-emitting unit group 202 in the second display area 222 share one second cathode 52. The second display area 222 includes at least two organic light-emitting unit groups 202, each of the at least two light-emitting unit groups 202 includes at least two organic light-emitting units 201. Two adjacent organic light-emitting unit groups 202 are spaced apart from each other by the first gap 203, and the first gap 203 extends to the photosensitive module setting area 210 and the bezel area 230.

Generally, the organic light-emitting unit of the organic light-emitting display panel 200 is formed by evaporation. The evaporation is performed by using an evaporation device and a mask. Films of the organic light-emitting unit may be formed by different materials and in different shapes, so different masks and different evaporation materials are used in the formation of the organic light-emitting unit. Therefore, in the evaporation process of the organic light-emitting unit, mask substitution and target substitution are required. Friction in the mask substitution and target substitution may generate. The electrostatic charges are trapped in the evaporated film, thereby causing a certain influence on the display of the organic light-emitting display panel 200.

In the embodiment of the present disclosure, the cathode 50 is not arranged in the first gap 203 of the second display area 222 of the organic light-emitting display panel 200, and the cathode 50 is not arranged on the light-emitting layer 40 of the organic light-emitting unit 201 in the second display area 222, so that the organic light-emitting unit 201 of the second display area 222 can emit light for display. In addition, the cathode 50 formed by evaporation includes the first cathode 51 and the second cathodes 52, the first cathode 51 may be spaced apart from the second cathodes 52 by a second gap 204, and two adjacent second cathodes 52 are spaced apart by the first gap 203, and the second cathode 52 has a relatively narrow width W in the X direction. Thus, electrostatic charges generated during the evaporation process are accumulated in the second cathode 52 due to the point discharge effect. Since the second cathode 52 has a small size, it is easier to provide an electrostatic discharge path to lead out the electrostatic charges accumulated in the second cathode 52, thereby reducing the influence of the electrostatic charges on the cathode 50 and improving the display effect of the display panel 200. In addition, since the second cathodes 52 and the first cathode 51 are spaced apart by the second gaps, and two adjacent second cathodes 52 are spaced apart by the first gap, even if the electrostatic charges accumulated in a certain second cathode 52 have no suitable discharge path, the breakdown at the second cathode 52 will not affect other second cathodes 52 and the first cathode 51, and the light-emitting units formed by other second cathodes 52 and the first cathode 51 can still normally emit light, thereby improving the yield of the organic light-emitting display panel 200 and reducing the production cost.

In addition, the cathode 50 may be formed by using only one mask. The mask can shield not only the bezel area 230 of the organic light-emitting display panel 200 and the photosensitive module setting area 210 but also the first gap 203 of the second display area 222. In this way, the portion of the mask shielding the photosensitive module setting area 210 and the portion of the mask shielding the frame area 230 are communicated by the portion of the mask shielding, such that the cathode 50 having a hollowed-out area can be formed by evaporation with the above mask. Compared with the related art in which the cathode of the organic light-emitting display panel is formed by using two masks, the organic light-emitting display panel 200 has a higher screen-to-body ratio, the product yield and the display effect are improved, and the production cost is reduced.

It should be noted that FIG. 2 and FIG. 3 are only exemplary drawings of the embodiments of the present disclosure, and the second display area 222 of the organic light-emitting display panel 200 in FIG. 2 includes at least two organic light-emitting unit groups 202, and each organic light-emitting unit group 202 includes at least two organic light-emitting units 201. In other embodiments of the present disclosure, the second display area of the organic light-emitting display panel may include one organic light-emitting unit group, all the organic light-emitting units in the one organic light-emitting unit group share one second cathode, the one second cathode and the first cathode are spaced apart by a gap 204 as shown in FIG. 2, and the gap 204 may also be communicated with the bezel area and the photosensitive module setting area. With such cathode configuration, the organic light-emitting display panel also has a high screen-to-body ratio, and the influence of electrostatic charges on the first cathode is also reduced.

Therefore, the number of the organic light-emitting unit groups in the second display area of the organic light-emitting display panel and the number of the organic light-emitting units in the organic light-emitting unit group are not specifically limited in the embodiments of the present disclosure. The second cathodes of the organic light-emitting unit groups in the second display area of the organic light-emitting display panel, and the first gap between two adjacent second cathodes will be described below by way of example with reference to FIGS. 4 to 7.

Figure 4:
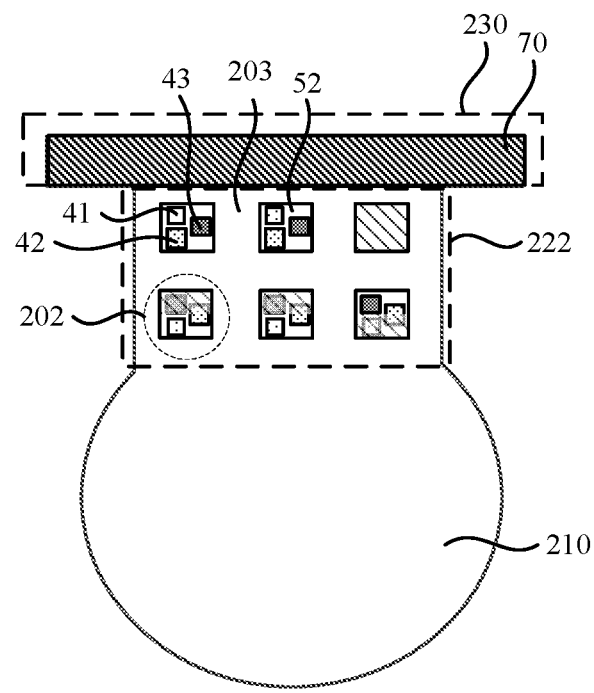
FIG. 4 is a top view of a part of an organic light-emitting display panel according to some embodiments of the present disclosure.
Figure 6:
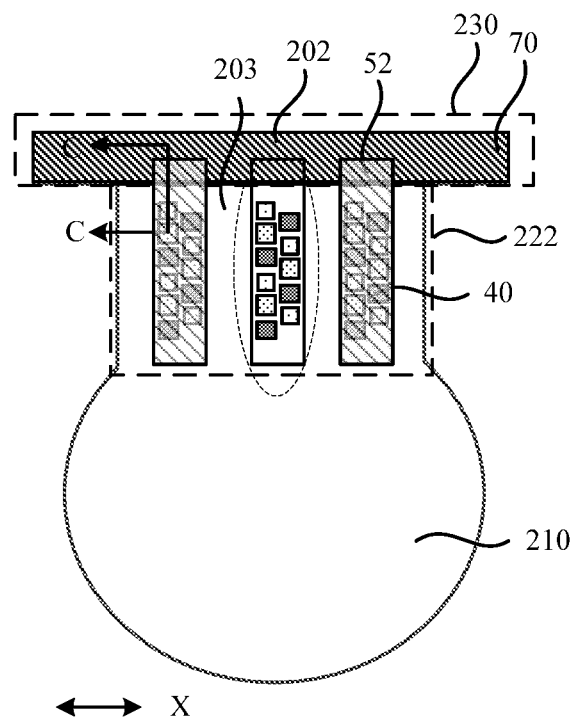
FIG. 6 is a top view of a part of another organic light-emitting display panel according to some embodiments of the present disclosure.
Figure 7:
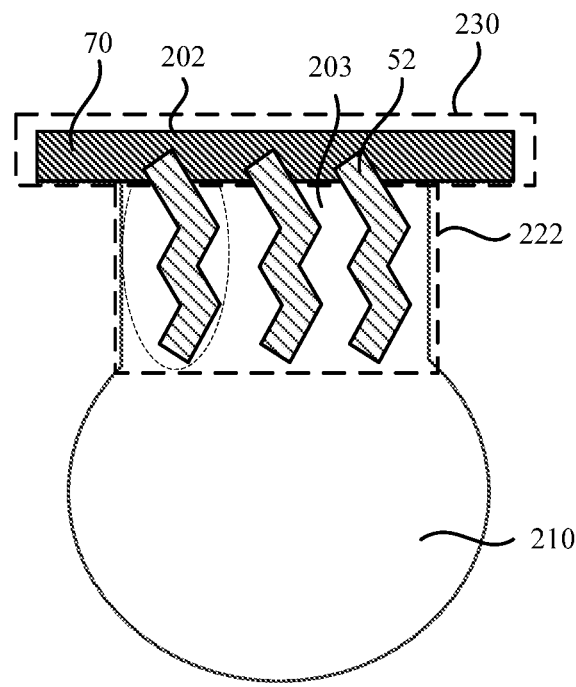
FIG. 7 is a top view of a part of another organic light-emitting display panel according to embodiments of the present disclosure.

As shown in FIGS. 4, 6 and 7, the first gap 203 is formed between two adjacent second cathodes 52 in the second display area 222 of the organic light-emitting display panel, and the structure of the first gap 203 includes one or more of grid, elongated rectangle, a zigzag line, and a polygonal line.

Exemplarily, as shown in FIG. 4, the first gap 203 has a grid shape, and the grid-shaped first gap 203 extends to the photosensitive module setting area 210 and the bezel area 230. The block-shaped second cathode 52 is in the opening of the grid-shaped first gap 203. The block-shaped second cathode 52 is shared by the organic light-emitting units in one organic light-emitting unit group 202. In an exemplary embodiment, the number of organic light-emitting units in the organic light-emitting unit group 202 is independent of the configuration of the pixel unit. For example, the pixel unit may include a red light-emitting unit, a green light-emitting unit, and a blue light-emitting unit, or the pixel unit may include Sub Pixel Rendering light-emitting units. In another exemplary embodiment, the number of organic light-emitting units in the organic light-emitting unit group 202 may be determined according to the number of organic light-emitting units in one pixel unit. For example, one pixel unit of the organic light-emitting display panel may include three organic light-emitting units. The three organic light-emitting units may be, for example, a red organic light-emitting unit, a green organic light-emitting unit, and a blue organic light-emitting unit. In the configuration where the organic light-emitting unit group 202 includes the red organic light-emitting unit, the green organic light-emitting unit, and the blue organic light-emitting unit, the second cathode 52 shared by the organic light-emitting units in the organic light-emitting unit group 202 should cover the light-emitting layer 41 of the red organic light-emitting unit, the light-emitting layer 42 of the green organic light-emitting unit, and the light-emitting layer 43 of the blue organic light-emitting unit, so that the second cathode 52 provides a cathode signal to the red organic light-emitting unit, the green organic light-emitting unit, and the blue organic light-emitting unit.

Figure 5:
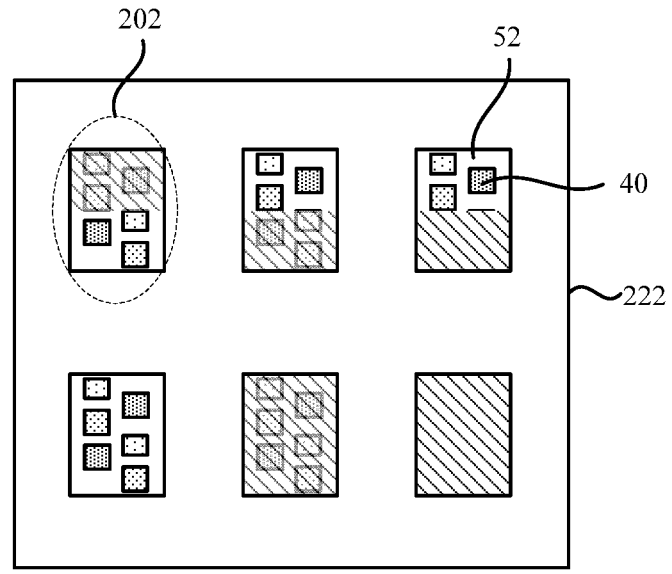
FIG. 5 is a top view of a part of another organic light-emitting display panel according to some embodiments of the present disclosure.

It should be noted that the organic light-emitting unit group 202 may include at least one organic light-emitting unit, that is, the organic light-emitting unit group 202 may include one or more organic light-emitting units. When the number of organic light-emitting units included in the organic light-emitting unit group corresponds to the number of organic light-emitting units included in the pixel unit, the number of organic light-emitting units in the organic light-emitting unit group may be determined according to the number of organic light-emitting units in one pixel unit, and the structure of the organic light-emitting unit group is determined according to the structure of the pixel unit. For example, the number of organic light-emitting units in the organic light-emitting unit group is equal to the number of organic light-emitting units in one pixel unit and the organic light-emitting unit group has a same structure as the pixel unit. Exemplarily, as shown in FIG. 5, the number of organic light-emitting units in the organic light-emitting unit group is equal to the number of organic light-emitting units in two pixel units. The number of the organic light-emitting units in the organic light-emitting unit and the number of the pixel units corresponding to the organic light-emitting unit group are not particularly limited in the embodiments of the present disclosure.

In an exemplary embodiment, as shown in FIG. 6, the first gap 203 is in an elongated rectangular shape, and the photosensitive module setting area 210 and the bezel area 230 are communicated by the elongated rectangular first gap 203. The elongated rectangular second cathode 52 is arranged in the opening between the elongated rectangular first gaps 203. The elongated rectangular second cathode 52 is shared by the organic light-emitting units in one organic light-emitting unit group 202. The organic light-emitting unit group 202 may include one or more organic light-emitting units in the X direction. Accordingly, in the X direction, the second cathode 52 covers the light-emitting layers 40 of one or more organic light-emitting units. As shown in FIG. 6, the organic light-emitting units are arranged in columns, and the second cathode 52 may cover the light-emitting layer 40 of one or more columns of organic light-emitting units. Each second cathode 52 is configured to provide a cathode signal to all the organic light-emitting units in the organic light-emitting unit group 202 corresponding to the second cathode 52.

In another exemplary embodiment, as shown in FIG. 7, the first gap 203 has a zigzag shape, and the photosensitive module setting area 210 and the bezel area 230 are communicated by the zigzag-shaped first gap 203. The zigzag-shaped second cathode 52 is arranged in the opening between the zigzag-shaped first gap 203. The zigzag-shaped second cathode 52 is shared by the organic light-emitting units in one organic light-emitting unit group 202. The second cathode 52 is configured to provide a cathode signal to all the organic light-emitting units in the organic light-emitting unit group 202. The zigzag-shaped second cathode 52 has corners, which reduce the clarity of diffraction fringes when the organic light-emitting units emit light, thereby improving the display uniformity of the organic light-emitting display panel.

It should be noted that, in the embodiment of the present disclosure, the first gaps in the second display area of the organic light-emitting display panel may have the same structure or have different structures. Accordingly, the second cathodes may have the same structure and shape or different structures and shapes. For example, the first gaps may include the elongated rectangular first gap and the zigzag-shaped first gap. The technical principle is similar to the structures shown in FIGS. 4 to 7, and the technical principle is not described again.

The light-emitting principle of the organic light-emitting display panel is as follows. When the anode of the organic light-emitting unit receives a positive-supply-voltage signal and the cathode of the organic light-emitting unit receives a negative-supply-voltage signal, holes are injected into the light-emitting layer from the anode and electrons are injected into the light-emitting layer from the cathode, and the recombination of the holes and electrons in the light-emitting layer can achieve light emission. The negative-supply-voltage signal is transmitted to the cathode of the organic light-emitting unit through the negative-supply-voltage signal transmission line.

In an exemplary embodiment, the organic light-emitting display panel further includes a negative-supply-voltage signal transmission line, and the negative-supply-voltage signal transmission line is located in the bezel area. The second display area of the organic light-emitting display panel further comprises a conductive connection portion which is electrically connected with the negative-supply-voltage signal transmission line and the second cathodes in the second display area of the organic light-emitting display panel.

In an exemplary embodiment, as shown in FIG. 4, the negative-supply-voltage signal transmission line 70 of the organic light-emitting display panel is located in the bezel area 230, and the negative-supply-voltage signal transmission line 70 can provide a negative-supply-voltage signal to the cathode of the organic light-emitting unit of the organic light-emitting display panel, so that the organic light-emitting unit can normally emit light for display. The organic light-emitting units of the organic light-emitting unit group 202 in the second display area 222 share the second cathode 52. The second cathode 52 may be a block shape. The block-shaped second cathode 52 is electrically connected to the negative-supply-voltage signal transmission line in the bezel area 230 via a conductive connection portion (not shown) provided in the second display area 222. The conductive connection portion may be arranged in an additional layer, and the conductive connection portion needs to have a higher light transmittance. Alternatively, the conductive connection portion may be disposed at the same layer as other conductive connection lines of the organic light-emitting display panel.

Alternatively, the conductive connection portion, by which the negative-supply-voltage signal transmission line and the second cathode are electrically connected, may be disposed in the same layer as the anode of the organic light-emitting unit in the organic light-emitting display panel.

Because the anode of the organic light-emitting unit has a high light transmittance, the problem of light transmittance does not need to be considered when the anode is arranged in the photosensitive module setting area. Therefore, in the process of forming the anode of the organic light-emitting unit, the conductive connection portion and the anode may be formed by the same procedure and made of the same material, which achieves the electrical connection between the second cathode and the negative-supply-voltage signal transmission line, simplifies the manufacturing process of the display panel, improves the production efficiency, and reduces the production cost.

Alternatively, the conductive connection portion is electrically connected to the second cathode through a first via, and the first via is located outside the light-emitting area of the organic light-emitting unit.

Figure 8:
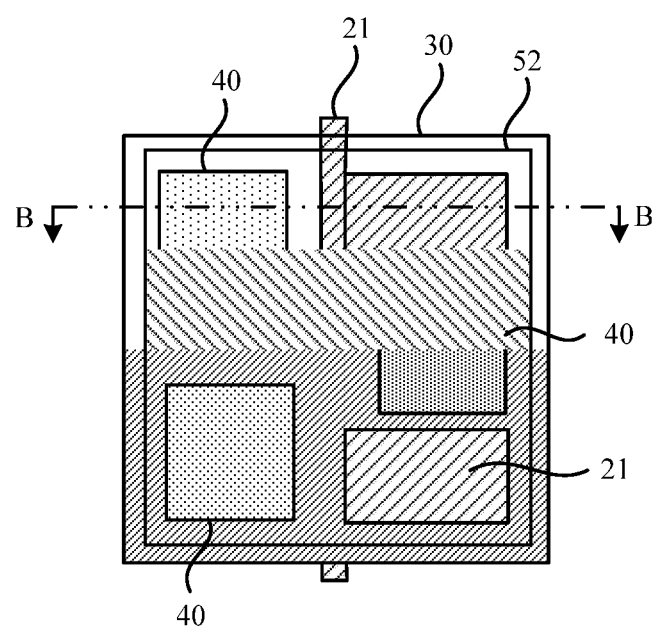
FIG. 8 is a top view illustrating films of a part of an organic light-emitting display panel according to embodiments of the present disclosure.
Figure 9:
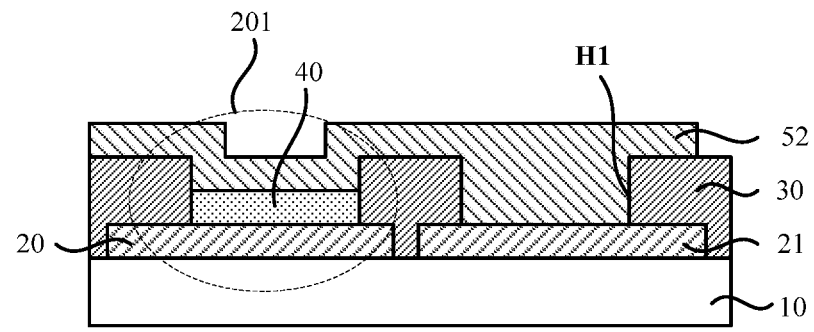
FIG. 9 is a cross-sectional view taken along the section line B-B in FIG. 8.

In an exemplary embodiment, with reference to FIG. 8 and FIG. 9, the conductive connection portion 21 and the anode 20 of the organic light-emitting unit 201 may be disposed in the same layer. Accordingly, the pixel defining layer 30 and other functional films (not shown) may be disposed between the second cathode 52 and the conductive connection portion 21, and the functional films may include, for example, carrier functional layers. The second cathode 52 is electrically connected to the conductive connection portion 21 through the first via, and accordingly the second cathode 52 is electrically connected to the negative-supplyvoltage signal transmission line in the bezel area through the conductive connection portion 21, so that the negative-supply-voltage signal transmitted by the negative-supply-voltage signal transmission line is transmitted to the second cathode 52 through the conductive connection portion 21.

Since the light emission of the organic light-emitting unit 201 is implemented through the recombination of carriers injected into the light-emitting layer, the light-emitting area of the organic light-emitting unit 201 is considered to be the area where the light-emitting layer 20 of the organic light-emitting unit 201 is located. In order not to affect the display and light emission of the light-emitting area of the organic light-emitting unit 201, the first via H1 should be disposed outside the light-emitting area of the organic light-emitting unit 201.

In addition, if the second cathode of the second display area of the light-emitting display panel is close to the bezel area, the second cathode can be directly and electrically connected with the negative-supply-voltage signal transmission line in the bezel area so as to obtain a negative-supply-voltage signal. The negative-supply-voltage signal transmission line and the second cathode may be arranged in different layers or in the same layer.

When the negative-supply-voltage signal transmission line and the second cathode are arranged in different layers, the negative-supply-voltage signal transmission line in the bezel area of the organic light-emitting display panel is electrically connected to the second cathode through the third via.

In an exemplary embodiment, as shown in FIG. 6 and FIG. 7, the shape of the second cathode 52 is an elongated rectangle and/or a zigzag line, and the elongated rectangular and/or zigzag second cathode 52 may extend into the bezel area 230, and thus may be electrically connected to the negative-supply-voltage signal transmission line in the bezel area 230 through the third via.

Figure 10:
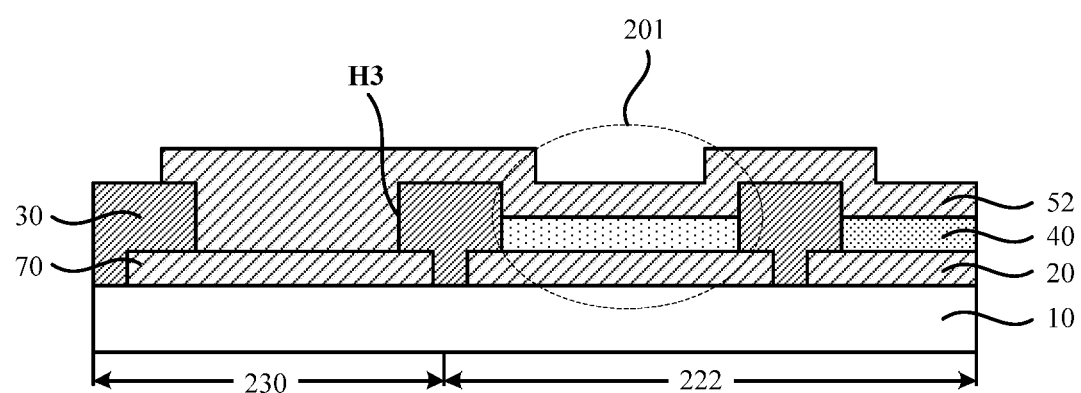
FIG. 10 is a cross-sectional view taken along the section line C-C in FIG. 6.

In an exemplary embodiment, with reference to FIG. 6 and FIG. 10, when the negative-supply-voltage signal transmission line 70 and the anode of the organic light-emitting unit 201 are disposed in the same layer, the second cathode 52 may extend into the bezel area and be electrically connected to the negative-supply-voltage signal transmission line 70 in the bezel area 230 through the third via H3, so that the negative-supply-voltage signal transmission line 70 can provide a negative-supply-voltage signal to the organic light-emitting units 201 sharing the second cathode 52.

According to the organic light-emitting display panel, the organic light-emitting units of the same organic light-emitting unit group in the second display area share the second cathode, two adjacent second cathodes are separated by the first gap, and the first gap is communicated with the bezel area and the photosensitive module setting area. Therefore the organic light-emitting display panel has a high screen-to-body ratio. Moreover, since the second cathodes are separated by the first gap, the electrostatic charges generated in the mask transport and evaporation process can be gathered into the second cathodes with smaller areas due to the point discharge effect. Therefore, the influence of electrostatic charges on the first cathode with a larger area is reduced, and the display effect of the organic light-emitting display panel is improved. In addition, only one mask is adopted in the forming process of the cathode layer of the organic light-emitting display panel, so that the production cost of the organic light-emitting display panel is reduced, the production yield of the organic light-emitting display panel is improved, and the display effect of the organic light-emitting display panel is improved.

An embodiment of the present disclosure provides a mask which is used for forming the cathode layer of the organic light-emitting display panel provided by the embodiment of the present disclosure. The organic light-emitting display panel includes a photosensitive module setting area 210, a display area 220 surrounding the photosensitive module setting area 210, and a bezel area 230 surrounding the display area 220. Correspondingly, the mask includes: a bezel shield part, a photosensitive-module shield part and a connecting structure. In one or more embodiments, the mask is made from metal such as Cr. The mask includes a hollowed area surrounded by the bezel shield part. The photosensitive-module shield part and the connecting structure are in the hollowed area, and the photosensitive-module shield part is connected to the bezel shield part through the connecting structure. The connecting structure includes at least one opening for cathode evaporation.

In an exemplary example, with reference to FIG. 3 and FIG. 4, in the evaporation process for forming the cathode layer of the organic light-emitting display panel by using the mask provided by the embodiment of the present disclosure, the bezel shield part of the mask correspondingly shields the bezel area 230 of the organic light-emitting display panel 200, and the photosensitive-module shield part of the mask correspondingly shields the photosensitive module setting area 210 of the organic light-emitting display panel 200. The connecting structure of the mask correspondingly shields the second display area 222 of the display area 220 of the organic light-emitting display panel 200. For example, the connecting structure may correspondingly shield the gap 203 between two adjacent second cathodes 52 in the second display area 222 of the organic light-emitting display panel 200. Cathode material is evaporated in the areas of the organic light-emitting display panel 200 exposed by the hollowed parts of the mask. In the organic light-emitting display panel 200 formed with the above mask, all the organic light-emitting display units in the first display area 221 share the first cathode, and the organic light-emitting units, shielded by the same cathode evaporation opening of the connecting structure, in the second display area 222 of the organic light-emitting display panel 200 share the second cathode.

On one hand, in the formation of the cathode 50 of the organic light-emitting display panel 200, the cathode 50 is not formed in the photosensitive module setting area 210, the light transmittance of the photosensitive module setting area 210 is not affected, and the organic light-emitting display panel has a high screen-to-body ratio. On the other hand, the formed cathode 50 includes the first cathode 51 and the second cathodes 52, and adjacent second cathodes 52 are separated by the first gap. The first cathode 51 is separated from the second cathode 52 by the second gap. Therefore, electrostatic charges generated during the evaporation process are accumulated, due to the point discharge effect, into the second cathodes 52 having a narrower width W. Since the second cathode 52 has smaller sizes, the electrostatic charges in second cathode are easily discharged through a electrostatic charge discharge path, thereby reducing the influence of electrostatic charges on the cathode 50 and improving the display effect of the display panel 200. Moreover, only one mask is used in the forming process of the cathode 50, so the number of the mask can be reduced, and the cost of the mask can be reduced. Furthermore, since only one mask is used, mask alignment is not needed, the problem of low evaporation yield caused by low alignment precision does not exist, so that the product yield of the display panel is improved, and the cost of the display panel is reduced.

It should be noted that the connecting structure of the mask may include one or more cathode evaporation openings, and the second cathode of the organic light-emitting display panel is formed in the area exposed by the cathode evaporation opening in the evaporation, and the second cathode may be shared by one or more organic light-emitting units. The following description will be made by taking an example in which the mask includes a plurality of cathode evaporation openings.

Figure 11:
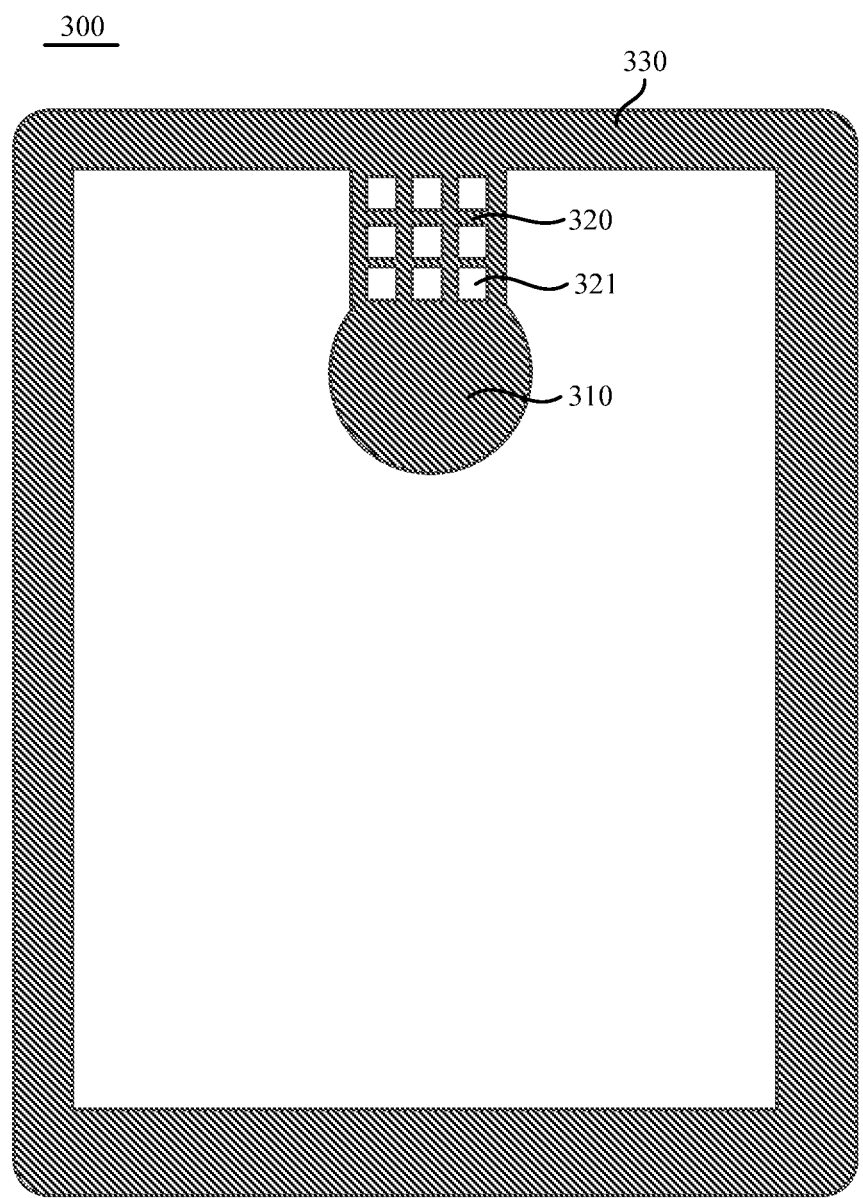
FIG. 11 is a schematic view of a mask according to embodiments of the present disclosure.

FIG. 11 is a schematic diagram of a mask according to an embodiment of the present disclosure. As shown in FIG. 11, the connecting structure 320 of the mask 300 is in a mesh structure, that is, the cathode evaporation openings are arranged in an array. Accordingly, the connecting structure 320 of the mask 300 has a plurality of cathode evaporation openings 321, and the cathode evaporation openings 321 are used for evaporation of the second cathodes of the organic light-emitting display panel provided by the embodiment of the present disclosure. The second cathode of the organic light-emitting display panel formed by evaporation is block-shaped.

Figure 12:
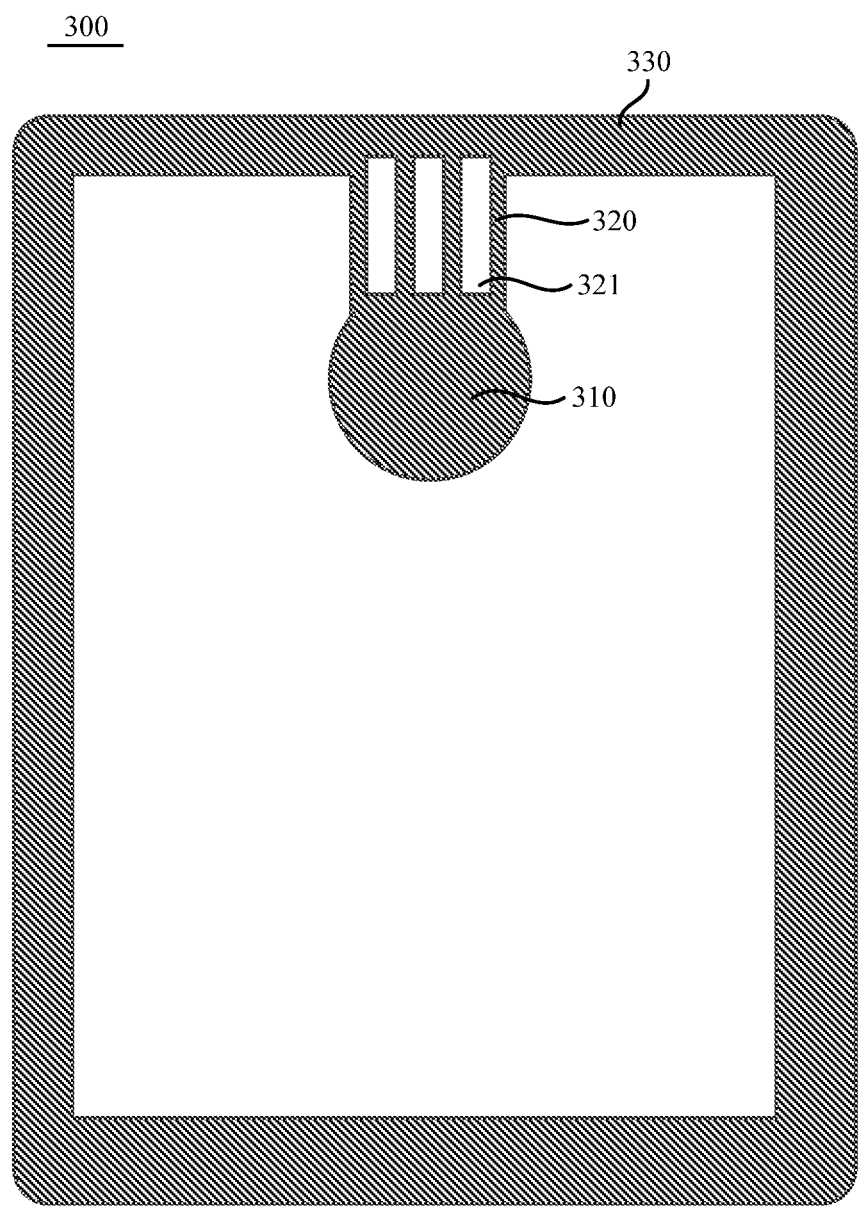
FIG. 12 is a schematic view of another mask according to embodiments of the present disclosure.

FIG. 12 is a schematic diagram of a mask according to another embodiment of the present disclosure. As shown in FIG. 12, the cathode evaporation opening 321 of the connecting structure 320 of the mask 300 is in the elongated rectangular shape. Thus, when the mask 300 is used in the evaporation of the cathode of the organic light-emitting display panel, the second cathode of the organic light-emitting display panel is in the elongated rectangular shape.

Figure 13:
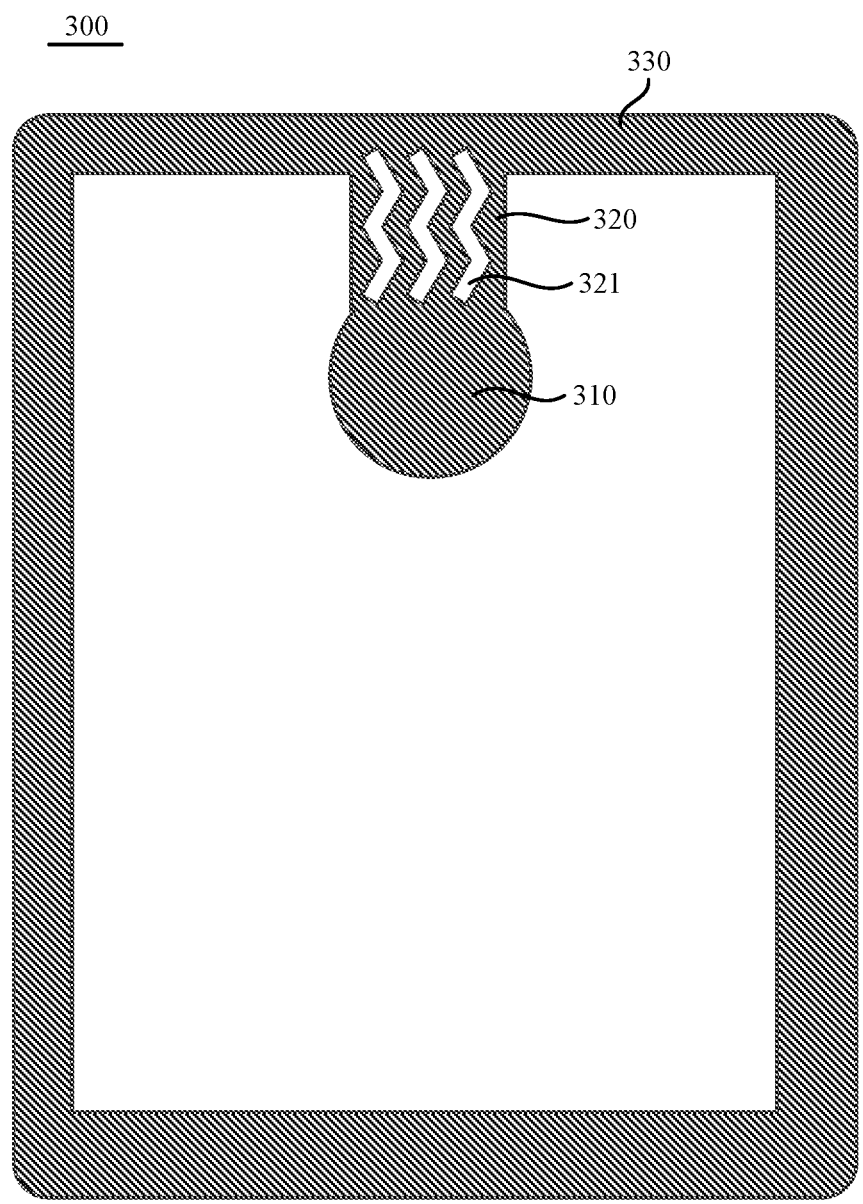
FIG. 13 is a schematic view of yet another mask according to embodiments of the present disclosure.

FIG. 13 is a schematic diagram of a mask according to yet another embodiment of the present disclosure. As shown in FIG. 13, the cathode evaporation opening 321 of the connection portion 320 in the mask 300 is in the zigzag shape. Thus, when the mask 300 is used in the evaporation process of the cathode of the organic light-emitting display panel, the second cathode of the organic light-emitting display panel is in the zigzag shape. The zigzag-shaped cathode can reduce the diffraction fringes generated by display and light-emitting in the second display area when the organic light-emitting display panel displays images, thereby improving the display uniformity of the organic light-emitting display panel.

An embodiment of the present disclosure further provides a method for manufacturing an organic light-emitting display panel, that is, the method can be used for forming the organic light-emitting display panel provided by the foregoing embodiment, so that the manufacturing method also has the beneficial effects of the organic light-emitting display panel, which can be understood by referring to the above explanation of the organic light-emitting display panel and will not be described again hereinafter.

An embodiment of the present disclosure further provides a method for manufacturing an organic light-emitting display panel. The manufacturing method is performed by using the mask provided by the embodiment of the present disclosure. The method includes: forming the cathode layer of the organic light-emitting display panel provided by the present disclosure through evaporation by utilizing the mask provided by the present disclosure.

Herein, with reference to FIG. 2 and FIG. 3, the organic light-emitting display panel 200 includes a plurality of organic light-emitting units 201. The organic light-emitting display panel 200 includes a photosensitive module setting area 210, a display area 220 surrounding the photosensitive module setting area 210, and a bezel area 230 surrounding the display area 220. The display area 220 includes a first display area 221 and a second display area 222. The plurality of organic light-emitting units 201 include organic light-emitting units 201 in the first display area 221 and organic light-emitting units 201 in the second display area 222. All the organic light-emitting units in the first display area 221 share the first cathode 51. The organic light-emitting units 201 in the second display area 222 include at least one organic light-emitting unit group 202, and each organic light-emitting unit group 202 includes at least one organic light-emitting unit 201. The at least one organic light-emitting units 201 in the same organic light-emitting unit group 202 shares one second cathode 52. Adjacent second cathodes 52 are separated by the first gap 203. The first cathode 51 is separated from the second cathodes 52 by the second gap 204. The gap is communicated with the photosensitive module setting area 210.

In the evaporation for the cathode layer, the photosensitive-module shield part of the mask shields the photosensitive module setting area 210, the connecting structure shields the second display area 222, and the cathode evaporation opening of the connecting structure is used for exposing the area where the second cathode 52 is formed. The hollowed area between the bezel shield part and the photosensitive-module shield part and the hollowed area between the bezel shield part and the connecting structure are used for exposing the area where forming the first cathode 51 is formed.

The mask provided by the embodiment of the present disclosure can be used for forming the cathode 50 of the organic light-emitting display panel 200. The cathode 50 is not formed in the photosensitive module setting area 210, so the light transmittance of the photosensitive module setting area 210 is not influenced, and the organic light-emitting display panel has a higher screen-to-body ratio. Moreover, adjacent second cathodes are spaced apart by the first gap, so that electrostatic charges generated in the mask transport and evaporation process can be gathered into the second cathode with smaller area due to the point discharge effect, the influence of the electrostatic charges on the first cathode with larger area is reduced, and the display effect of the organic light-emitting display panel is improved. In addition, only one mask is used in the evaporation process of the cathode 50 of the organic light-emitting display panel, the number of mask can be reduced, the number of evaporation procedures is reduced, and the requirement on alignment precision is reduced, so that the cost of the mask is reduced, the product yield of the organic light-emitting display panel is improved, and the cost of the organic light-emitting display panel is reduced.

The embodiment of the present disclosure also provides a display device, which includes the organic light-emitting display panel provided by the embodiment of the present disclosure, so that the display device also has the beneficial effects of the organic light-emitting display panel provided by the embodiment of the present disclosure, which can be understood by referring to the above description and will not described in detail below.

Figure 14:
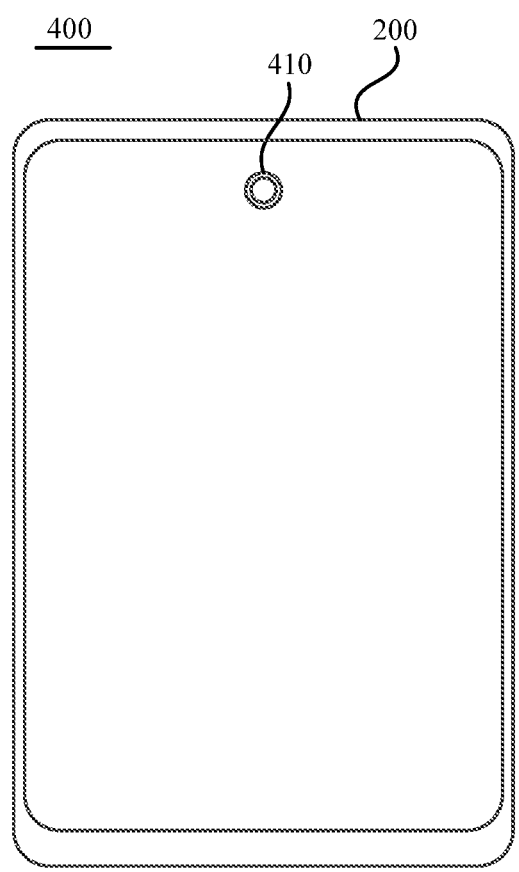
FIG. 14 is a schematic view of a display device according to embodiments of the present disclosure.

FIG. 14 is a schematic diagram of a display device according to the embodiment of the present disclosure. As shown in FIG. 14, the display device 400 includes an organic light-emitting display panel 200, and may further include a photosensitive module 410 disposed in a photosensitive module setting area of the organic light-emitting display panel 200. The photosensitive module 410 includes one or more of: a camera, a optical sensor, an ultrasonic distance sensor, and a pendant.

Exemplarily, the display device 400 is a mobile phone or a tablet. In an exemplary embodiment, the photosensitive module 410 is a camera, the photosensitive module setting area is an area where a front camera of the mobile phone or the tablet is located. The front camera receives the incident light through the photosensitive module setting area to collect external images. In another exemplary embodiment, the photosensitive module 410 is a optical sensor, the optical sensor may be configured to sense external light for adjusting the brightness of the display device 400, or used for fingerprint recognition. The optical sensor also receives external light through the photosensitive module setting area.

In one or more embodiments, the organic light-emitting display panel 200 in the photosensitive module setting area may be completely removed, that is, a hole running through the organic light-emitting display panel 200 is formed, and the photosensitive module 410 is disposed in the hole, that is, a display device 400 having a hole is formed. Alternatively, the organic light-emitting display panel 200 in the photosensitive module setting area may be partially reserved, and the reserved part should meet the light transmittance requirement of the photosensitive module 410. In this case, the photosensitive module 410 is placed on the back surface of the organic light-emitting display panel 200, the back surface is opposite to the light-emitting surface of the organic light-emitting display panel 200, that is, the display device 400 with the pseudo-hole is formed.

Exemplarily, the display device 400 may be a mobile phone, a tablet computer, a smart wearable device and other display devices known to those skilled in the art, which is not limited in the embodiments of the present disclosure.

It is to be noted that the above are merely exemplary embodiments of the present disclosure and the technical principles used therein. It will be understood by those skilled in the art that the present disclosure is not limited to the specific embodiments described herein. Those skilled in the art can make various apparent modifications, adaptations and substitutions without departing from the scope of the present disclosure. Therefore, while the present disclosure has been described in detail through the above-mentioned embodiments, the present disclosure is not limited to the above-mentioned embodiments and may include more other equivalent embodiments without departing from the concept of the present disclosure.

What is claimed is:

1. An organic light-emitting display panel, comprising:
a plurality of organic light-emitting units;
a first display area; and
a second display area;
wherein the plurality of organic light-emitting units comprises first organic light-emitting units in the first display area and second organic light-emitting units in the second display area, and the second display area is less than the first display area;
wherein the first organic light-emitting units share a first cathode;
wherein the second organic light-emitting units comprise at least one organic light-emitting unit group, each comprising at least one organic light-emitting unit; wherein in a same organic light-emitting unit group comprising a plurality of organic light-emitting units, the plurality of organic light-emitting units in the same organic light-emitting unit group share a second cathode; wherein the second cathode has a zigzag edge segment.

2. The organic light-emitting display panel of claim 1, wherein two adjacent second cathodes are spaced apart by a first gap; wherein the zigzag edge segment is located in the first gap.

3. The organic light-emitting display panel of claim 1, further comprising: a negative-supply-voltage signal transmission line located in a bezel area of the organic light-emitting display panel,
wherein the second display area further comprises a conductive connection portion, wherein the conductive connecting portion is electrically connected to the negative-supply-voltage signal transmission line and the second cathode.

4. The organic light-emitting display panel of claim 3, wherein each of the plurality of organic light-emitting units comprises an anode, and the conductive connecting portion and the anode are disposed in a same layer.

5. The organic light-emitting display panel of claim 3, wherein the conductive connecting portion is electrically connected to the second cathode through a first via, and wherein the first via is located outside a light-emitting zone of each of the plurality of organic light-emitting units.

6. The organic light-emitting display panel of claim 1, further comprising: a negative-supply-voltage signal transmission line located in a bezel area of the organic light-emitting display panel, wherein the second cathode is electrically connected to the negative-supply-voltage signal transmission line through a third via.

7. A display device, comprising: an organic light-emitting display panel;
wherein the organic light-emitting display panel comprises a plurality of organic light-emitting units, a first display area and a second display area;
wherein the plurality of organic light-emitting units comprises first organic light-emitting units in the first display area and second organic light-emitting units in the second display area, and the second display area is less than the first display area;
wherein the first organic light-emitting units share a first cathode;
wherein the second organic light-emitting units comprise at least one organic light-emitting unit group, each comprising at least one organic light-emitting unit; wherein in a same organic light-emitting unit group comprising a plurality of organic light-emitting units, the plurality of organic light-emitting units in the same organic light-emitting unit group share a second cathode; wherein the second cathode has a zigzag edge segment.

8. The display device of claim 7, wherein two adjacent second cathodes are spaced apart by a first gap; wherein the zigzag edge segment is located in the first gap.

9. The display device of claim 7, wherein the organic light-emitting display panel further comprises: a negative-supply-voltage signal transmission line located in a bezel area or the organic light-emitting display panel,
wherein the second display area further comprises a conductive connection portion, wherein the conductive connecting portion is electrically connected to the negative-supply-voltage signal transmission line and the second cathode.

10. The display device of claim 9, wherein each of the plurality of organic light-emitting units comprises an anode, and the conductive connecting portion and the anode are disposed in a same layer.

11. The display device of claim 9, wherein the conductive connecting portion is electrically connected to the second cathode through a first via, and wherein the first via is located outside a light-emitting zone of each of the plurality of organic light-emitting units.

12. The organic light-emitting display panel of claim 7, wherein the organic light-emitting display panel further comprises: a negative-supply-voltage signal transmission line located in a bezel area of the organic light-emitting display panel, wherein the second cathode is electrically connected to the negative-supply-voltage signal transmission line through a third via.

13. An organic light-emitting display panel, comprising:
a plurality of organic light-emitting units;
a first display area; and
a second display area;
wherein the plurality of organic light-emitting units comprises first organic light-emitting units in the first display area and second organic light-emitting units in the second display area;
wherein the first organic light-emitting units share a first cathode;
wherein the second organic light-emitting units comprise at least one organic light-emitting unit group, each comprising at least one organic light-emitting unit; wherein in a same organic light-emitting unit group comprising a plurality of organic light-emitting units, the plurality of organic light-emitting units in the same organic light-emitting unit group share a second cathode; wherein the second cathode has a zigzag edge segment;
wherein the organic light-emitting display panel further comprises: a negative-supply-voltage signal transmission line located in a bezel area of the organic light-emitting display panel,
wherein the second display area further comprises a conductive connection portion, wherein the conductive connecting portion is electrically connected to the negative-supply-voltage signal transmission line and the second cathode;
wherein the conductive connecting portion is electrically connected to the second cathode through a first via, and wherein the first via is located outside a light-emitting zone of each of the plurality of organic light-emitting units.

14. A display device, comprising: the organic light-emitting display panel of claim 13.

15. The organic light-emitting display panel of claim 13, wherein two adjacent second cathodes are spaced apart by a first gap; wherein the zigzag edge segment is located in the first gap.

16. A display device, comprising: the organic light-emitting display panel of claim 15.

17. The organic light-emitting display panel of claim 13, wherein each of the plurality of organic light-emitting units comprises an anode, and the conductive connecting portion and the anode are disposed in a same layer.

18. A display device, comprising: the organic light-emitting display panel of claim 17.

19. The organic light-emitting display panel of claim 13, further comprising: a negative-supply-voltage signal transmission line located in a bezel area of the organic light-emitting display panel, wherein the second cathode is electrically connected to the negative-supply-voltage signal transmission line through a third via.

20. A display device, comprising: the organic light-emitting display panel of claim 19.

* * * * *